(12) United States Patent
Li

(10) Patent No.: US 11,869,935 B2
(45) Date of Patent: Jan. 9, 2024

(54) SEMICONDUCTOR DEVICE AND METHOD OF FABRICATING THE SAME

(71) Applicant: WUHAN XINXIN SEMICONDUCTOR MANUFACTURING CO., LTD., Hubei (CN)

(72) Inventor: Le Li, Hubei (CN)

(73) Assignee: WUHAN XINXIN SEMICONDUCTOR MANUFACTURING CO., LTD., Hubei (CN)

( * ) Notice: Subject to any disclaimer, the term of this patent is extended or adjusted under 35 U.S.C. 154(b) by 53 days.

(21) Appl. No.: 17/555,062

(22) Filed: Dec. 17, 2021

(65) Prior Publication Data
US 2022/0352306 A1 Nov. 3, 2022

(30) Foreign Application Priority Data
Apr. 30, 2021 (CN) .......................... 202110482497.5

(51) Int. Cl.
*H01L 29/06* (2006.01)
*H01L 27/088* (2006.01)

(52) U.S. Cl.
CPC ........ *H01L 29/0649* (2013.01); *H01L 27/088* (2013.01); *H01L 29/0607* (2013.01)

(58) Field of Classification Search
CPC ............. H01L 29/0646; H01L 29/0607; H01L 29/66772; H01L 29/78654;
(Continued)

(56) References Cited

U.S. PATENT DOCUMENTS

| 2002/0048972 A1* | 4/2002 | Yamaguchi ....... H01L 29/78621 |
| | | 257/734 |
| 2004/0169251 A1 | 9/2004 | Ohyanagi et al. |

(Continued)

FOREIGN PATENT DOCUMENTS

| CN | 1375879 A | 10/2002 |
| CN | 102623507 A | 8/2012 |

(Continued)

*Primary Examiner* — Dao H Nguyen
(74) *Attorney, Agent, or Firm* — Muncy, Geissler, Olds & Lowe, P.C.

(57) ABSTRACT

A semiconductor device and a method of fabricating same are disclosed. The semiconductor device includes: an SOI substrate including, stacked from the bottom upward, a lower substrate, a buried insulator layer and a semiconductor layer, wherein active regions surrounded by trench isolation structures are formed in the semiconductor layer; a gate electrode layer formed over the semiconductor layer, the gate electrode layer extending from active regions to trench isolation structures; and a source region and a drain region formed in the active regions that are on opposing sides of the gate electrode layer, wherein at least one end portion of the gate electrode layer laterally spans over interfaces of the active regions and the trench isolation structures toward the source region and/or the drain region. Thereby leakage at the interfaces of the active regions and the trench isolation structures can be reduced, resulting in improved performance of the semiconductor device.

18 Claims, 5 Drawing Sheets

(58) Field of Classification Search
CPC ........... H01L 29/42356; H01L 29/0603; H01L 29/0642; H01L 29/0684; H01L 29/66477; H01L 27/088
See application file for complete search history.

(56) References Cited

U.S. PATENT DOCUMENTS

| | | | |
|---|---|---|---|
| 2005/0072975 A1* | 4/2005 | Chen | H01L 29/4908 257/E29.151 |
| 2008/0076196 A1* | 3/2008 | Yamaguchi | H01L 29/78615 257/E29.281 |
| 2010/0081239 A1* | 4/2010 | Min | H01L 21/26506 438/151 |
| 2017/0141126 A1* | 5/2017 | Willard | H01L 27/0207 |
| 2017/0141134 A1* | 5/2017 | Willard | H01L 29/78615 |
| 2018/0248013 A1 | 8/2018 | Chowdhury et al. | |
| 2020/0176476 A1* | 6/2020 | Hirano | H01L 27/092 |
| 2020/0258992 A1* | 8/2020 | Matsumoto | H01L 29/0642 |

FOREIGN PATENT DOCUMENTS

| | | |
|---|---|---|
| CN | 102683416 A | 9/2012 |
| CN | 107516676 A | 12/2017 |
| CN | 110890421 A | 3/2020 |
| CN | 110943078 A | 3/2020 |

\* cited by examiner

SEMICONDUCTOR DEVICE AND METHOD OF FABRICATING THE SAME

CROSS-REFERENCES TO RELATED APPLICATION

This application claims the priority of Chinese patent application number 202110482497.5, filed on Apr. 30, 2021, the entire contents of which are incorporated herein by reference.

TECHNICAL FIELD

The present disclosure relates to the field of semiconductor integrated circuit (IC) fabrication, more particularly to a semiconductor device and a method of fabricating the semiconductor device.

BACKGROUND

Semiconductor-on-insulator (SOI) structures include a lower substrate, a buried insulator layer and an upper semiconductor layer and have been widely used in radio frequency (RF), high voltage, radiation-sensitive and many other applications thanks to a variety of advantages over ordinary semiconductor substrates, such as latch-up elimination, mitigated short-channel effects and enhanced radiation resistance.

In the field of SOI devices, the floating body effect has been one of the subjects of intense research efforts. One of the available countermeasures to the floating body effect involves depleting electron holes accumulated in the electrically floating body above the buried insulator layer and at the bottom of the upper semiconductor layer through bringing the body into contact with an external object. At present, commonly used device structures with body contact include body-tied-to-source (BTS) structures, H-shaped gate structure devices and T-shaped gate structure devices.

Reference is now made to FIG. 1, a schematic illustration of a BTS structure. As can be seen from FIG. 1, active regions (not shown) surrounded by shallow trench isolation (STI) structures (not shown) are defined in an upper semiconductor layer (not shown), and a gate electrode layer 11 is formed over the upper semiconductor layer. A source region 12 and a drain region 13 are formed in the active regions on opposite sides of the gate electrode layer 11, and a body contact region 14 is formed in the source region 12. The body contact region 14 is formed in the source region 12 by such an ion implantation process that also proceeds from the upper semiconductor layer into a portion of the gate electrode layer 11 (indicated by the area A1 in FIG. 1), thus ensuring that the resulting body contact region 14 is brought into contact with the gate electrode layer 11. Since opposing end portions of the rectangular gate electrode layer 11 extend from the active regions to the surrounding STI structures, significant leakage may occur at interfaces between the active regions and the STI structures.

Therefore, there is an urgent need to reduce leakage at edges of a transistor.

SUMMARY OF THE INVENTION

It is an objective of the present disclosure to provide a semiconductor device with reduced leakage at its edges where active regions interface with trench isolation structures and thus improved performance, as well as a method of fabricating such a semiconductor device.

The above objective is attained by a semiconductor device provided in the present disclosure, which includes:

an SOI substrate including, stacked from the bottom upward, a lower substrate, a buried insulator layer and a semiconductor layer, wherein active regions surrounded by trench isolation structures are formed in the semiconductor layer;

a gate electrode layer formed over the semiconductor layer, the gate electrode layer extending from the active regions to the trench isolation structures; and a source region and a drain region formed in the active regions that are on opposing sides of the gate electrode layer, wherein at least one end portion of the gate electrode layer laterally spans over interfaces of the active regions and the trench isolation structures toward the source region and/or the drain region.

Optionally, the semiconductor device may further include a body contact region, which is formed in the source region and brought into contact with the gate electrode layer.

Optionally, the semiconductor device may further include an ion-doped gate region, which is formed in the gate electrode layer and extends from the side of the gate electrode layer closer to the body contact region toward the drain region, wherein the body contact region comes into contact with the ion-doped gate region in the direction from the source region toward the drain region.

Optionally, the gate electrode layer may include a base gate section and an extended gate section, wherein the source region and the drain region are formed in the active regions that are on opposing sides of the base gate section, wherein at least one end portion of the base gate section laterally spans over interfaces of the active regions and the trench isolation structures toward the source region and/or the drain region, and wherein the extended gate section extends at least from the base gate section toward the source region.

Optionally, the extension of the extended gate section at least from the base gate section toward the source region may include:

extension of the extended gate section from the base gate section toward the source region; or extension thereof from the base gate section toward both the source region and the drain region.

Optionally, in the case of the extended gate section extending from the base gate section toward the source region, the ion-doped gate region may be entirely located in the extended gate section, or may further extend therefrom into the base gate section.

Optionally, in the case of the extended gate section extending from the base gate section toward both the source region and the drain region, the ion-doped gate region may be entirely located in the portion of the extended gate section located closer to the source region, or may further extend therefrom into the base gate section, or even into the portion of the extended gate section located closer to the drain region.

Optionally, the source region and the drain region may be of the same conductivity type, wherein the body contact region and the ion-doped gate region are of the same conductivity type, and wherein the body contact region and the source region are of different conductivity types.

Optionally, a gate dielectric layer may be present between the gate electrode layer and the semiconductor layer.

The above object is also attained by another semiconductor device provided in the present disclosure, which includes:

a semiconductor-on-insulator substrate comprising, stacked from the bottom upward, a lower substrate, a buried insulator layer and a semiconductor layer, wherein active regions surrounded by trench isolation structures are formed in the semiconductor layer;

a gate electrode layer formed over the semiconductor layer, the gate electrode layer extending from the active regions to the trench isolation structures, wherein the gate electrode layer comprises a base gate section and an extended gate section;

a source region and a drain region respectively formed in the active regions that are on opposing sides of the base gate section, wherein at least one end portion of the gate electrode layer laterally spans over interfaces of the active regions and the trench isolation structures toward the source region and/or the drain region; and a body contact region straddling over the extended gate section and remote from the base gate section.

Optionally, the body contact region may be formed in the source region and brought into contact with the gate electrode layer.

Optionally, the extended gate section may extend from the base gate section toward the source region.

Optionally, the semiconductor device may further include an ion-doped gate region, which is entirely located in the extended gate section, and wherein the body contact region may come into contact with the ion-doped gate region.

Optionally, the body contact region may straddle over an end of the extended gate section.

The above object is also attained by a method of fabricating a semiconductor device provided in the present disclosure, which includes:

providing an SOI substrate including, stacked from the bottom upward, a lower substrate, a buried insulator layer and a semiconductor layer, wherein active regions surrounded by trench isolation structures are formed in the semiconductor layer;

forming a gate electrode layer over the semiconductor layer, the gate electrode layer extending from the active regions to the trench isolation structures; and forming a source region and a drain region in the active regions that are on opposing sides of the gate electrode layer, wherein at least one end portion of the gate electrode layer laterally spans over interfaces of the active regions and the trench isolation structures toward the source region and/or the drain region.

Optionally, the method may further include forming a body contact region in the source region and an ion-doped gate region in the gate electrode layer, the body contact region in contact with the gate electrode layer, the ion-doped gate region extending from the side of the gate electrode layer closer to the body contact region toward the drain region, the body contact region coming into contact with the ion-doped gate region in the direction from the source region toward the drain region.

Optionally, the gate electrode layer may include a base gate section and an extended gate section, wherein the source region and the drain region are formed in the active regions that are on opposing sides of the base gate section, wherein at least one end portion of the base gate section laterally spans over interfaces of the active regions and the trench isolation structures toward the source region and/or the drain region, and wherein the extended gate section extends at least from the base gate section toward the source region.

Optionally, the extension of the extended gate section at least from the base gate section toward the source region may include: extension of the extended gate section from the base gate section toward the source region; or extension thereof from the base gate section toward both the source region and the drain region.

Optionally, in the case of the extended gate section extending from the base gate section toward the source region, the ion-doped gate region may be entirely located in the extended gate section, or may further extend therefrom into the base gate section.

Optionally, in the case of the extended gate section extending from the base gate section toward both the source region and the drain region, the ion-doped gate region may be entirely located in the portion of the extended gate section located closer to the source region, or may further extend therefrom into the base gate section, or even into the portion of the extended gate section located closer to the drain region.

Compared to the prior art, the present disclosure has the following advantages:

1. In the semiconductor device, since at least one end portion of the gate electrode layer laterally spans over the interfaces of the active regions and the trench isolation structures toward the source region and/or the drain region, a gate length of this or these end portions is greater than both a gate length of the portion of the gate electrode layer between the end portions, resulting in reduced leakage at the interfaces and improved performance of the semiconductor device.

2. In the method, since at least one end portion of the gate electrode layer laterally spans over the interfaces of the active regions and the trench isolation structures toward the source region and/or the drain region, a gate length of this or these end portions is greater than both a gate length of the portion of the gate electrode layer between the end portions, resulting in reduced leakage at the interfaces and improved performance of the semiconductor device.

BRIEF DESCRIPTION OF THE DRAWINGS

In FIGS. 1 to 6,

11—gate electrode layer; 12—source region; 13—drain region; 14—body contact region; 201—lower substrate; 202—buried insulator layer; 203—semiconductor layer; 21—gate electrode layer; 211—base gate section; 212—extended gate section; 22—source region; 23—drain region; 24—body contact region; 25—ion-doped gate region.

DETAILED DESCRIPTION

Objectives, advantages and features of the present disclosure will become more apparent from the following detailed description of the proposed semiconductor device and method, which is to be read in connection with the accompanying drawings. Note that the figures are provided in a very simplified form not necessarily drawn to exact scale for the only purpose of helping to explain the embodiments disclosed herein in a more convenient and clearer way.

In embodiments of the present disclosure, there is provided a semiconductor device including an SOI substrate, a gate electrode layer, a source region and a drain region. The SOI substrate includes, stacked from the bottom upward, a lower substrate, a buried insulator layer and a semiconductor layer. Active regions are formed in the semiconductor layer and surrounded by trench isolation structures. The gate electrode layer is formed over the semiconductor layer so as to extend from the active regions to the trench isolation structures. The source and drain regions are formed in the active regions on opposing sides of the gate electrode layer. At least one end portion of the gate electrode layer laterally spans over interfaces of the active regions and the trench isolation structures toward the source region and/or the drain region.

Figure 3A:
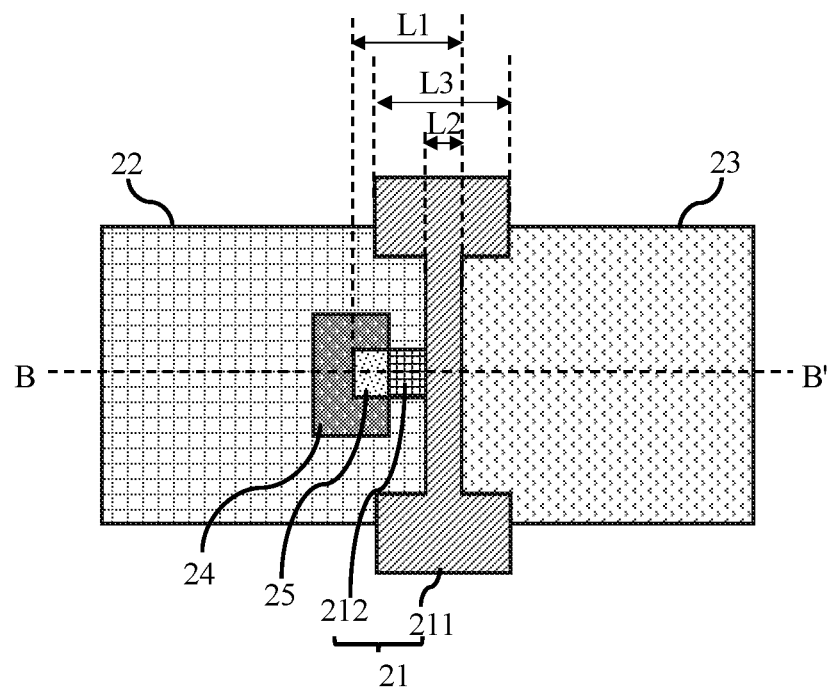
FIGS. 3a to 3b schematically illustrate a semiconductor device according to a second embodiment of the present disclosure.
Figure 3B:
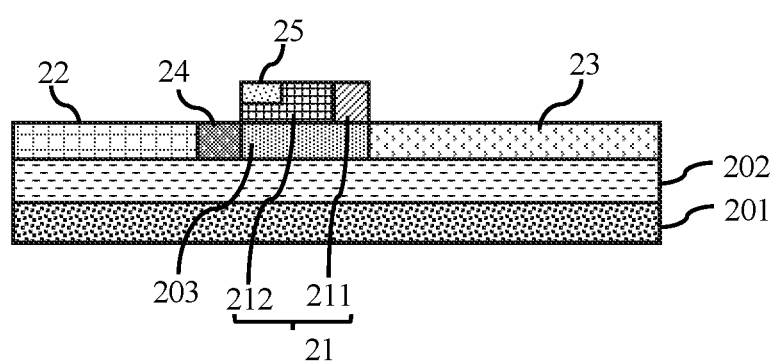
Figure 4A:
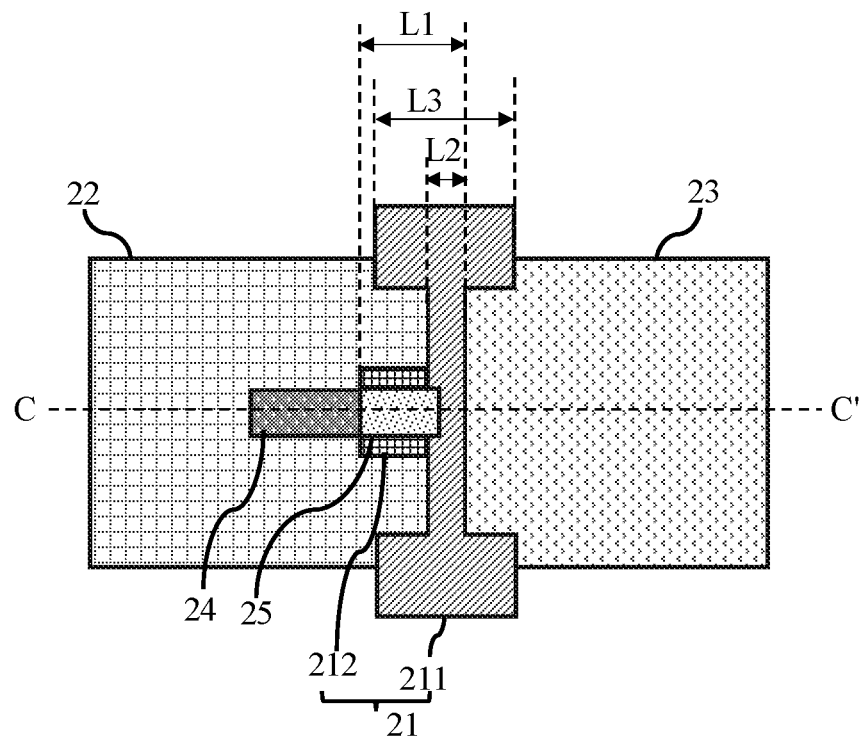
FIGS. 4a to 4b schematically illustrate a semiconductor device according to a third embodiment of the present disclosure.
Figure 4B:
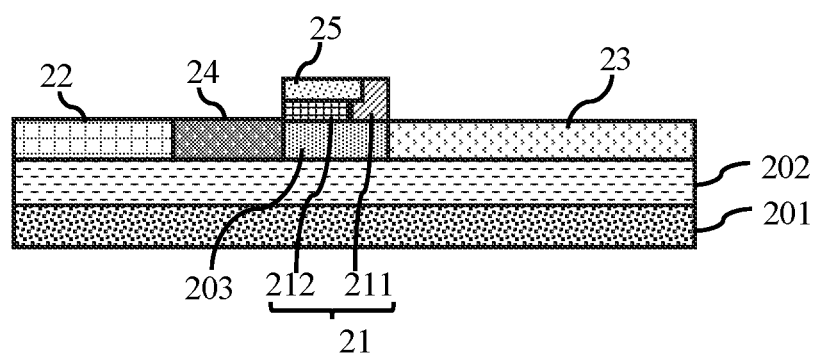
Figure 5A:
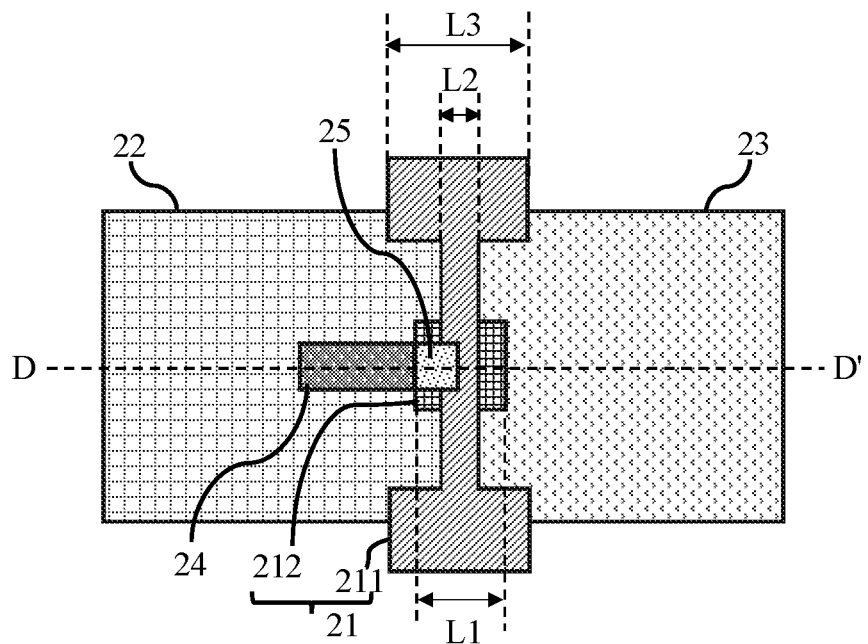
FIGS. 5a to 5b schematically illustrate a semiconductor device according to a fourth embodiment of the present disclosure.
Figure 5B:
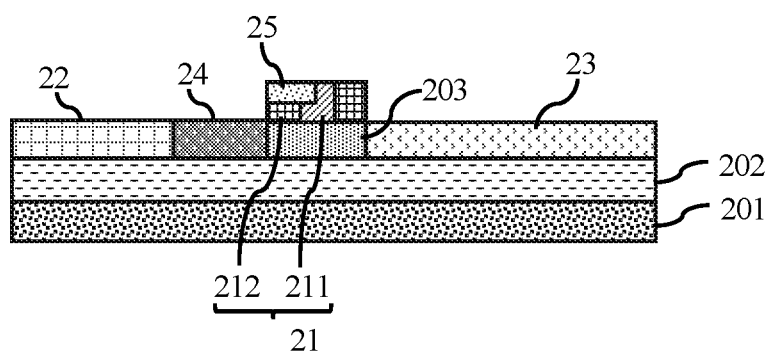

Semiconductor devices according to embodiments of the present disclosure are described in detail below with reference to FIGS. 2a to 5b. FIGS. 2a, 3a, 4a and 5a are schematic top views of the semiconductor devices. FIG. 2b is a schematic cross-sectional view of the semiconductor device of FIG. 2a taken along AA'. FIG. 3b is a schematic cross-sectional view of the semiconductor device of FIG. 3a taken along BB'. FIG. 4b is a schematic cross-sectional view of the semiconductor device of FIG. 4a taken along CC'. FIG. 5b is a schematic cross-sectional view of the semiconductor device of FIG. 5a taken along DD'.

The semiconductor-on-insulator (SOI) substrate includes, stacked from the bottom upward, the lower substrate 201, the buried insulator layer 202 and the semiconductor layer 203. The semiconductor layer 203 may be formed of any suitable semiconductor material. Examples of the material may include, but are not limited to, silicon, germanium, silicon germanium, silicon germanium carbide, silicon carbide and any other suitable semiconductor material. The buried insulator layer 202 may be for example, a silicon oxide layer.

The active regions (not shown) are formed in the semiconductor layer 203 and surrounded by the trench isolation structures (not shown). The trench isolation structures contact the buried insulator layer 202 at the bottom and are flush with or slightly higher than the semiconductor layer 203 at the top. The trench isolation structures may be formed of silicon oxide, silicon oxynitride or the like.

The gate electrode layer 21 is so formed over the semiconductor layer 203 so to extend from the active regions to the trench isolation structures. The gate electrode layer 21 may be separated from the semiconductor layer 203 by a gate dielectric layer (not shown). The gate electrode layer 21, the gate dielectric layer and the semiconductor layer 203 form parasitic capacitors.

The gate dielectric layer may be formed of silicon oxide (with a relative dielectric constant of 4.1) or a high-k dielectric with a relative dielectric constant greater than 7. Examples of the high-k dielectric may include, but are not limited to, silicon oxynitride, titanium dioxide and tantalum pentoxide. Alternatively, the gate dielectric layer may be formed of a material with a low dielectric constant. Examples of this material may include, but are not limited to, silicon oxycarbide (SiOC, with a relative dielectric constant of 2.5) and inorganic or organic spin-on glass (SOG, with a relative dielectric constant of 3 or lower). A lower dielectric constant of the gate dielectric layer can result in less parasitic capacitance.

The source region 22 and the drain region 23 are formed in the active regions on opposing sides of the gate electrode layer 21. A channel region underlies the gate electrode layer 21 between the source region 22 and the drain region 23. Due to a very small thickness of the semiconductor layer 203, the source region 22 and the drain region 23 may span either the entire thickness of the semiconductor layer 203 or part thickness thereof.

At least one end portion (i.e., one or opposing end portions) of the gate electrode layer 21 laterally spans over interfaces of the active regions and the trench isolation structures toward the source or drain region, or toward both the source and drain region. Here, the direction from the source region 22 to the drain region 23 is defined as a gate length direction.

The gate electrode layer 21 extends over the STI structures at both ends. For example, in the first embodiment shown in FIGS. 2a and 2b, opposing ends portions of the gate electrode layer 21 laterally span over the interfaces of the active regions and the trench isolation structures toward both the source region 22 and the drain region 23 so that the gate electrode layer 21 assumes a shape resembling the letter "I". The opposing end portions of the gate electrode layer 21 that laterally span over the interfaces of the active regions and the trench isolation structures (i.e., the horizontal bars of the "I"-like shape) both have a gate length L3 that is greater than a gate length L1 of a portion of the gate electrode layer 21 between the end portions (i.e., the vertical connecting bar of the "I"-like shape).

The semiconductor device further includes a body contact region 24, which is formed in the source region 22 and brought into contact with the gate electrode layer 21.

The body contact region 24 may span either the entire thickness of the semiconductor layer 203 or part thickness thereof. The body contact region 24 is intended for external connection of the semiconductor layer 203 (i.e., the body) under the channel region.

As used herein, the "contact" means that it needs to be contacted at the interfaces as viewed from the top. For example, in the first embodiment shown in FIGS. 2a to 2b, the body contact region 24 extends in the direction from the source region 22 toward the drain region 23 and comes into contact with the portion of the gate electrode layer 21 between the end portions thereof.

The semiconductor device further includes an ion-doped gate region 25 formed in the gate electrode layer 21, which extends from the side of the gate electrode layer 21 closer to the body contact region 24 toward the drain region 23. The body contact region 24 comes into (partial or full) contact with the ion-doped gate region 25 along the direction from the source region 22 toward the drain region 23.

Figure 2A:
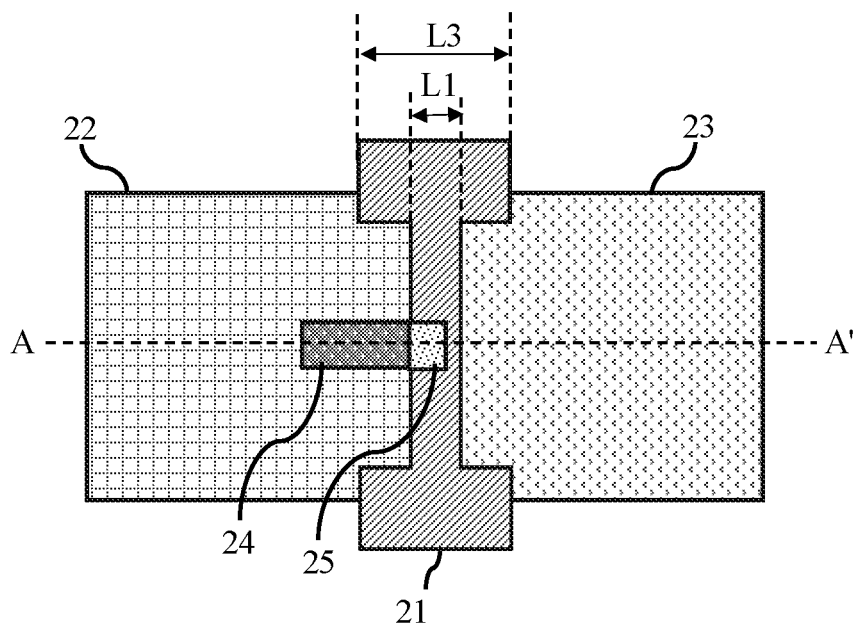
FIGS. 2a to 2b schematically illustrate a semiconductor device according to a first embodiment of the present disclosure.
Figure 2B:
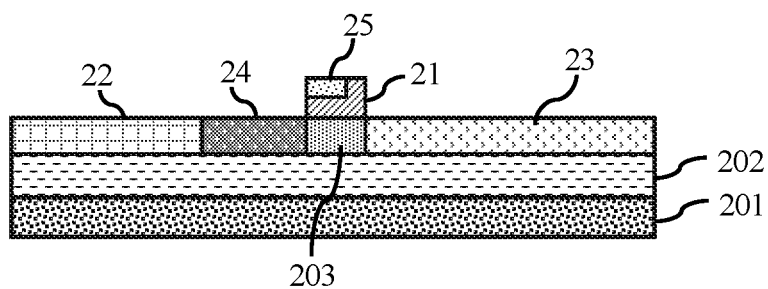

For example, in the first embodiment shown in FIGS. 2a to 2b, the ion-doped gate region 25 is formed in the portion of the gate electrode layer 21 between the end portions thereof, and a portion of the body contact region 24 close to the gate electrode layer 21 comes into full contact with the ion-doped gate region 25 along the direction from the source region 22 toward the drain region 23.

The gate electrode layer 21 may include a base gate section 211 and an extended gate section 212. In this case, the source region 22 and the drain region 23 are formed in the active regions on opposing sides of the base gate section 211. At least one end portion of the base gate section 211 laterally spans over interfaces of the active regions and the trench isolation structures toward the source region 22 or the drain region 23, or toward both the source region 22 and the drain region 23. The extended gate section 212 extends at least from the base gate section 211 toward the source region 22. The base gate section 211 may be perpendicular to the extended gate section 212 or not.

For example, in the second to fourth embodiments shown in FIG. 3a to FIG. 5b, opposing end portions of the base gate section 211 laterally span interfaces of the active regions and the trench isolation structures toward both the source region 22 and the drain region 23 so that the base gate section 211 assumes a shape resembling the letter "I". The opposing end portions of the base gate section 211 that laterally span over the interfaces of the active regions and the trench isolation structures (i.e., the horizontal bars of the "I"-like shape) both have a gate length L3 that is greater than a gate length L2 of a portion of the base gate section 211 between the end portions (i.e., the vertical connecting bar of the "I"-like shape).

The extension of the extended gate section 212 at least from the base gate section 211 toward the source region 22 may include extension thereof from the base gate section 211 toward the source region 22 or extension thereof from the base gate section 211 toward both the source region 22 and the drain region 23. In the embodiments shown in FIGS. 3a to 3b and 4a to 4b, the extended gate section 212 extends from the base gate section 211 toward the source region 22, and a gate length L1 of the portion of the gate electrode layer 21 containing the extended gate section 212 is the sum of a gate length of the base gate section 211 and a gate length of the extended gate section 212 that is located closer to the source region 22. In the embodiment of FIGS. 5a to 5b, the extended gate section 212 extends from the base gate section 211 toward both the source region 22 and the drain region 23, and a gate length L1 of the portion of the gate electrode layer 21 containing the extended gate section 212 is the sum of a gate length of the base gate section 211, a gate length of the portion of the extended gate section 212 that is located closer to the source region 22, and a gate length of the portion of the extended gate section 212 that is located closer to the drain region 23. The gate length L1 of the portion of the gate electrode layer 21 containing the extended gate section 212 is greater than the gate length L2 of the portion of the base gate section 211 between the end portions thereof.

In contrast to the embodiment shown in FIGS. 2a to 2b where the entire portion of the gate electrode layer 21 between the end portions thereof has the desired gate length L1, in the embodiments shown in FIGS. 3a to 5b, only the portion of the gate electrode layer 21 in contact with the body contact region 24 has the desired gate length L1 (equal to the sum of the gate length of the portion of the base gate section 211 between the end portions thereof and the gate length of the extended gate section 212), while the portions of the base gate section 211 between the end portions thereof and the extended gate section 212 have the gate length L2 that is less than L1. This allows for a reduced area of the gate electrode layer 21, which results in less parasitic capacitance, reduced power consumption, an increased on-current and hence improved performance of the semiconductor device.

In the embodiments shown in FIGS. 3a to 5b, the body contact region 24 extends in the direction from the source region 22 toward the drain region 23 and comes into contact with the extended gate section 212 (or the portion thereof located closer to the source region 22).

A width of the body contact region 24 may exceed a width of the extended gate section 212 or not, or may be equal thereto. In the embodiment shown in FIGS. 3a and 3b, the width of the body contact region 24 exceeds that of the extended gate section 212, and the body contact region 24 surrounds a portion of the extended gate section 212 that is farther away from the base gate section 211, that is, the body contact region 24 straddles over the extended gate section 212 and is remote from the base gate section 211. In the embodiment shown in FIGS. 3a and 3b, the body contact region 24 straddles over an end of the extended gate section 212. Alternatively, in the embodiments shown in FIGS. 4a to 4b and 5a to 5b, the width of the body contact region 24 does not exceed that of the extended gate section 212. As can be seen from FIGS. 3a, 4a and 5a, the width of the body contact region 24 refers to the dimension thereof perpendicular to BB', CC' or DD'.

In the case of the extended gate section 212 extending from the base gate section 211 toward the source region 22, the ion-doped gate region 25 extends from the side of the extended gate section 212 closer to the body contact region 24 toward the drain region 23. The ion-doped gate region 25 is situated within the extended gate section 212 and optionally extends from the extended gate section 212 into the base gate section 211. In the embodiment shown in FIGS. 3a and 3b, the ion-doped gate region 25 is entirely formed within the extended gate section 212 without contacting the base gate section 211, and is surrounded by the body contact region 24. In the embodiment shown in FIGS. 4a to 4b, the ion-doped gate region 25 extends from the side of the extended gate section 212 closer to the body contact region 24 into the base gate section 211.

In the case of the extended gate section 212 extending from the base gate section 211 toward both the source region 22 and the drain region 23, the ion-doped gate region 25 extends from the side of the extended gate section 212 (more exactly, of the portion thereof located closer to the source region 22) closer to the body contact region 24 toward the drain region 23. The ion-doped gate region 25 may be situated within the portion of the extended gate section 212 closer to the source region 22 and optionally extend from this portion into the base gate section 211 (as shown in FIGS. 5a to 5b) or even into the portion of the extended gate section 212 closer to the drain region 23.

In the case where the width of the body contact region 24 does not exceed the width of the extended gate section 212 and the body contact region 24 is in contact with the ion-doped gate region 25, the width of the body contact region 24 may be equal to the width of the ion-doped gate region 25.

Since the body contact region 24 is in contact with the gate electrode layer 21, and because the ion-doped gate region 25 extends from the side of the gate electrode layer 21 closer to the body contact region 24 toward the drain region 23 and comes into contact with the body contact region 24 in the direction from the source region 22 toward the drain region 23, there is no horizontal gap between the body contact region 24 and the ion-doped gate region 25.

The body contact region 24 and the ion-doped gate region 25 may be formed in the semiconductor layer 203 and the gate electrode layer 21, respectively, either in a single ion implantation process, or in separate implantation processes. In contrast to forming the body contact region 24 and the ion-doped gate region 25 in separate implantation processes, forming them in a single ion implantation process can better make sure that there is no horizontal gap between them and allows direct contact of the body contact region 24 with the gate electrode layer 21. This enables the body contact region 24 to deplete electron holes accumulated in the body, thus mitigating the floating body effect.

The source region 22 and the drain region 23 are of the same conductivity type, while the ion-doped gate region 25 and the body contact region 24 are of the same conductivity type. The body contact region 24 and the source region 22 are of different conductivity types. Therefore, if the source region 22 and the drain region 23 are of the N conductivity type, then the ion-doped gate region 25 and the body contact region 24 are of the P conductivity type. If the source region 22 and the drain region 23 are of the P conductivity type, then the ion-doped gate region 25 and the body contact region 24 are of the N conductivity type. Examples of N-type ions may include phosphorus and arsenic ions, while examples of P-type ions may include boron and gallium ions.

Figure 1:
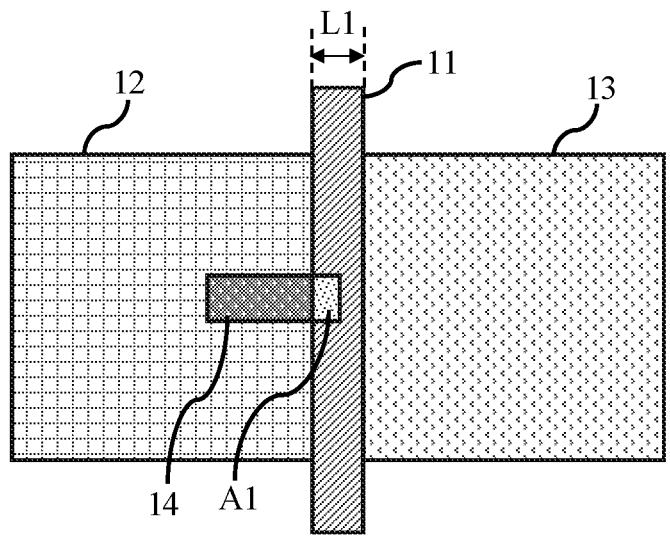
FIG. 1 is a schematic top view of a conventional body-tied-to-source (BTS) structure.

As can be seen from the above-discussed structure of the semiconductor device, since at least one end portion of the gate electrode layer 21 laterally spans over the interfaces of the active regions and the trench isolation structures toward the source region 22 and/or the drain region 23, the gate length L3 of this or these end portions is greater than both the gate length L1 of the portion of the gate electrode layer 21 between the end portions and the gate length L1 of the end portions of the rectangular gate electrode layer 11 in the semiconductor device structure shown in FIG. 1, resulting in reduced leakage at the interfaces and improved performance of the semiconductor device.

Additionally, in order to mitigate the floating body effect, the body contact region 24 must be brought into contact with the gate electrode layer 21. In order to ensure contact of the body contact region 24 with the gate electrode layer 21, during design of the affected range of the ion implantation process for forming the body contact region 24, considering the critical dimensions (CD) of the processes for forming the gate electrode layer 21 and the body contact region 24 and possible errors in alignment accuracy of the used photomasks, it is necessary for the affected range to encompass at least part of the gate electrode layer 21. This requires the portion of the gate electrode layer 21 to be brought into contact with the body contact region 24 to have a sufficient gate length. However, an excessive gate length of the gate electrode layer 21 may degrade the performance of the semiconductor device being fabricated. For example, it may lead to problems such as significant parasitic capacitance between the gate electrode layer 21, the gate dielectric layer and the semiconductor layer 203, increased power consumption and a reduced on-current. Through designing the gate electrode layer 21 as consisting of the base gate section 211 and the extended gate section 212, it is only necessary to maintain the desired gate length at the portion of the gate electrode layer 21 brought into contact with the body contact region 24 (i.e., L1, the sum of the gate length of the portion of the base gate section 211 joined to the extended gate section 212 and the gate length of the extended gate section 212) while allowing the portions of the base gate section 211 between the end portions thereof and the extended gate section 212 to have the gate length L2 that is less than the gate length L1. Compared to the designs shown in FIGS. 1 and 2a where the gate length L1 is maintained throughout the portion of the gate electrode layer between the end portions thereof, this design allows the gate electrode layer on the semiconductor layer to have a smaller area, e.g., a minimum allowable area of the base gate section 211 according to certain design rules, with the same channel width of the base gate section 211. Furthermore, as there is no horizontal gap between the body contact region 24 and the ion-doped gate region 25, improved performance of the semiconductor device, reduced parasitic capacitance, lower power consumption and an increased on-current are achievable while taking into account the critical dimensions (CD) of the processes for forming the gate electrode layer 21 and the body contact region 24 and possible errors in alignment accuracy of the used photomasks.

Figure 6:
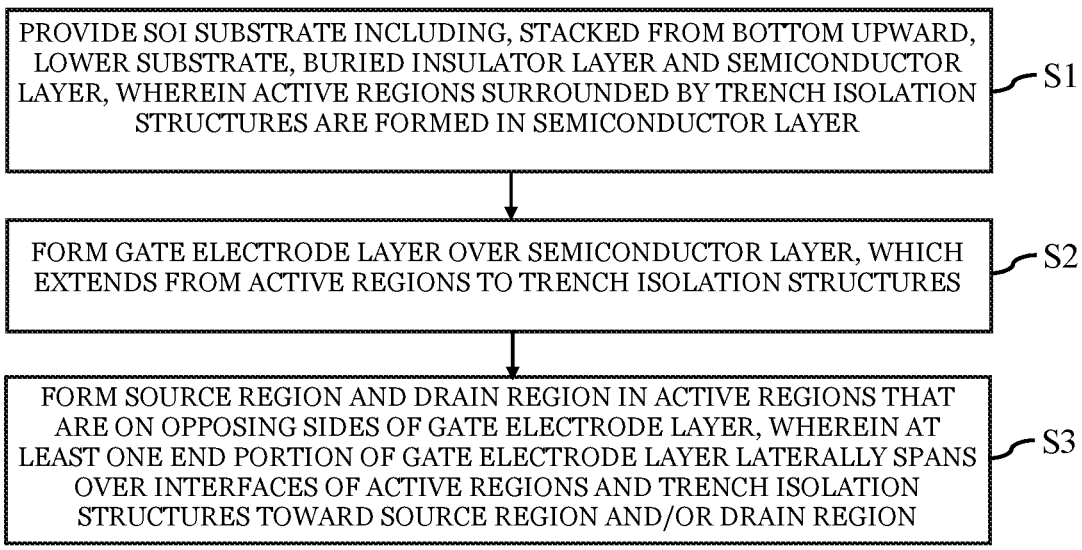
FIG. 6 is a flowchart of a method of fabricating a semiconductor device according to an embodiment of the present disclosure.

In embodiments of the present disclosure, there is also provided a method of fabricating a semiconductor device, as shown in the flowchart of FIG. 6. The method includes the steps of:

S1) providing an SOI substrate including, stacked from the bottom upward, a lower substrate, a buried insulator layer and a semiconductor layer, wherein active regions surrounded by trench isolation structures are formed in the semiconductor layer;

S2) forming a gate electrode layer over the semiconductor layer, the extending from the active regions to the trench isolation structures; and S3) forming a source region and a drain region in the active regions that are on opposing sides of the gate electrode layer, wherein at least one end portion of the gate electrode layer laterally spans over interfaces of the active regions and the trench isolation structures toward the source region and/or the drain region.

The method will be described in greater detail below with reference to FIGS. 2a to 5b.

In step S1, the semiconductor-on-insulator (SOI) substrate is provided, which includes, stacked from the bottom upward, the lower substrate 201, the buried insulator layer 202 and the semiconductor layer 203.

The semiconductor layer 203 may be formed of any suitable semiconductor material. Examples of the material may include, but are not limited to, silicon, germanium, silicon germanium, silicon germanium carbide, silicon carbide and any other suitable semiconductor material. The buried insulator layer 202 may be for example, a silicon oxide layer.

The active regions (not shown) are formed in the semiconductor layer 203 and surrounded by the trench isolation structures (not shown). In case of being shallow trench isolation (STI) structures, the trench isolation structures may be formed using any suitable technique known in the art. The trench isolation structures contact the buried insulator layer 202 at the bottom and are flush with or slightly higher than the semiconductor layer 203 at the top. The trench isolation structures may be formed of silicon oxide, silicon oxynitride or the like.

In step S2, the gate electrode layer 21 extending from the active regions to the trench isolation structures is formed over the semiconductor layer 203.

The formation of the gate electrode layer 21 may involve: depositing a gate electrode material over the semiconductor layer 203 and the trench isolation structures; and etching and patterning the material with the aid of identically patterned photoresist.

Prior to the formation of the gate electrode layer 21 over the semiconductor layer 203, a gate dielectric layer (not shown) may be formed on the semiconductor layer 203. The gate electrode layer 21, the gate dielectric layer and the semiconductor layer 203 form parasitic capacitors.

The gate dielectric layer may be formed of silicon oxide (with a relative dielectric constant of 4.1) or a high-k dielectric with a relative dielectric constant greater than 7. Examples of the high-k dielectric may include, but are not limited to, silicon oxynitride, titanium dioxide and tantalum pentoxide. Alternatively, the gate dielectric layer may be formed of a material with a low dielectric constant. Examples of this material may include, but are not limited to, silicon oxycarbide (SiOC, with a relative dielectric constant of 2.5) and inorganic or organic spin-on glass (SOG, with a relative dielectric constant of 3 or lower). A lower dielectric constant of the gate dielectric layer can result in less parasitic capacitance.

In step S3, the source region 22 and the drain region 23 are formed in the active regions that are on opposing sides of the gate electrode layer 21. A channel region underlies the gate electrode layer 21 between the source region 22 and the drain region 23. Due to a very small thickness of the semiconductor layer 203, the source region 22 and the drain region 23 may span either the entire thickness of the semiconductor layer 203 or part thickness thereof.

At least one end portion (i.e., one or opposing end portions) of the gate electrode layer 21 laterally spans over interfaces of the active regions and the trench isolation structures toward the source region 22 or the drain region 23, or toward both the source region 22 and the drain region 23. Here, the direction from the source region 22 to the drain region 23 is defined as a gate length direction.

The gate electrode layer 21 extends over the STI structures at both ends. For example, in the first embodiment shown in FIGS. 2a and 2b, opposing ends portions of the gate electrode layer 21 laterally span over the interfaces of the active regions and the trench isolation structures toward both the source region 22 and the drain region 23 so that the gate electrode layer 21 assumes a shape resembling the letter "I". The opposing end portions of the gate electrode layer 21 that laterally span over the interfaces of the active regions and the trench isolation structures (i.e., the horizontal bars of the "I"-like shape) both have a gate length L3 that is greater than a gate length L1 of a portion of the gate electrode layer 21 between the end portions (i.e., the vertical connecting bar of the "I"-like shape).

The method may further include forming a body contact region 24 in the source region 22 and an ion-doped gate region 25 in the gate electrode layer 21. The body contact region 24 may be brought into contact with the gate electrode layer 21, and the ion-doped gate region 25 may extend from the side of the gate electrode layer 21 closer to the body contact region 24 toward the drain region 23. The body contact region 24 may come into (partial or full) contact with the ion-doped gate region 25 along the direction from the source region 22 toward the drain region 23. The body contact region 24 may span either the entire thickness of the semiconductor layer 203 or part thickness thereof. The body contact region 24 is intended for external connection of the semiconductor layer 203 (i.e., the body) under the channel region.

As used herein, the "contact" at the interfaces is mentioned as viewed from the top. For example, in the embodiment shown in FIGS. 2a to 2b, the body contact region 24 extends in the direction from the source region 22 toward the drain region 23 and comes into contact with the portion of the gate electrode layer 21 between the end portions thereof. Moreover, the ion-doped gate region 25 is formed in the portion of the gate electrode layer 21 between the end portions thereof, and a portion of the body contact region 24 close to the gate electrode layer 21 comes into full contact with the ion-doped gate region 25 along the direction from the source region 22 toward the drain region 23.

The gate electrode layer 21 formed in step S2 may include a base gate section 211 and an extended gate section 212. In this case, the source region 22 and the drain region 23 are formed in the active regions on opposing sides of the base gate section 211. At least one end portion of the base gate section 211 laterally spans over interfaces of the active regions and the trench isolation structures toward the source region 22 or the drain region 23, or toward both the source region 22 and the drain region 23. The extended gate section 212 extends at least from the base gate section 211 toward the source region 22. The base gate section 211 may be perpendicular to the extended gate section 212 or not.

For example, in the embodiments shown in FIG. 3a to FIG. 5b, opposing end portions of the base gate section 211 laterally span interfaces of the active regions and the trench isolation structures toward both the source region 22 and the drain region 23 so that the base gate section 211 assumes a shape resembling the letter "I". The opposing end portions of the base gate section 211 that laterally span over the interfaces of the active regions and the trench isolation structures (i.e., the horizontal bars of the "I"-like shape) both have a gate length L3 that is greater than a gate length L2 of a portion of the base gate section 211 between the end portions (i.e., the vertical connecting bar of the "I"-like shape).

The extension of the extended gate section 212 at least from the base gate section 211 toward the source region 22 may include extension thereof from the base gate section 211 toward the source region 22 or extension thereof from the base gate section 211 toward both the source region 22 and the drain region 23. In the embodiments shown in FIGS. 3a to 3b and 4a to 4b, the extended gate section 212 extends from the base gate section 211 toward the source region 22, and a gate length L1 of the portion of the gate electrode layer 21 containing the extended gate section 212 is the sum of a gate length of the base gate section 211 and a gate length of the extended gate section 212 that is located closer to the source region 22. In the embodiment of FIGS. 5a to 5b, the extended gate section 212 extends from the base gate section 211 toward both the source region 22 and the drain region 23, and a gate length L1 of the portion of the gate electrode layer 21 containing the extended gate section 212 is the sum of a gate length of the base gate section 211, a gate length of the portion of the extended gate section 212 that is located closer to the source region 22, and a gate length of the portion of the extended gate section 212 that is located closer to the drain region 23. The gate length L1 of the portion of the gate electrode layer 21 containing the extended gate section 212 is greater than the gate length L2 of the portion of the base gate section 211 between the end portions thereof.

In contrast to the embodiment shown in FIGS. 2a to 2b where the entire portion of the gate electrode layer 21 between the end portions thereof has the desired gate length L1, in the embodiments shown in FIGS. 3a to 5b, only the portion of the gate electrode layer 21 in contact with the body contact region 24 has the desired gate length L1 (equal to the sum of the gate length of the portion of the base gate section 211 between the end portions thereof and the gate length of the extended gate section 212), while the portions of the base gate section 211 between the end portions thereof and the extended gate section 212 have the gate length L2 that is less than L1. This allows for a reduced area of the gate electrode layer 21, which results in less parasitic capacitance, reduced power consumption, an increased on-current and hence improved performance of the semiconductor device.

In the embodiments shown in FIGS. 3a to 5b, the body contact region 24 extends in the direction from the source region 2 toward the drain region 23 and comes into contact with the extended gate section 212 (or the portion thereof located closer to the source region 22).

A width of the body contact region 24 may exceed a width of the extended gate section 212 or not, or may be equal to the width of the extended gate section 212. In the embodiment shown in FIGS. 3a and 3b, the width of the body contact region 24 exceeds that of the extended gate section 212, and the body contact region 24 surrounds a portion of the extended gate section 212 that is farther away from the base gate section 211. Alternatively, in the embodiments shown in FIGS. 4a to 4b and 5a to 5b, the width of the body contact region 24 does not exceed that of the extended gate section 212. As can be seen from FIGS. 3a, 4a and 5a, the width of the body contact region 24 refers to the dimension thereof perpendicular to BB', CC' or DD'.

In the case of the extended gate section 212 extending from the base gate section 211 toward the source region 22, the ion-doped gate region 25 extends from the side of the extended gate section 212 closer to the body contact region 24 toward the drain region 23. The ion-doped gate region 25 is situated within the extended gate section 212 and optionally extends from the extended gate section 212 into the base gate section 211. In the embodiment shown in FIGS. 3a and 3b, the ion-doped gate region 25 is entirely formed within the extended gate section 212 without contacting the base gate section 211, and is surrounded by the body contact region 24. In the embodiment shown in FIGS. 4a to 4b, the ion-doped gate region 25 extends from the side of the extended gate section 212 closer to the body contact region 24 into the base gate section 211.

In the case of the extended gate section 212 extending from the base gate section 211 toward both the source region 22 and the drain region 23, the ion-doped gate region 25 extends from the side of the extended gate section 212 (more exactly, of the portion thereof located closer to the source region 22) closer to the body contact region 24 toward the drain region 23. The ion-doped gate region 25 may be situated within the portion of the extended gate section 212 closer to the source region 22 and optionally extend from this portion into the base gate section 211 (as shown in FIGS. 5a to 5b) or even into the portion of the extended gate section 212 closer to the drain region 23.

In the case where the width of the body contact region 24 does not exceed the width of the extended gate section 212 and the body contact region 24 is in contact with the ion-doped gate region 25, the width of the body contact region 24 may be equal to that of the ion-doped gate region 25.

Since the body contact region 24 is in contact with the gate electrode layer 21, and because the ion-doped gate region 25 extends from the side of the gate electrode layer 21 closer to the body contact region 24 toward the drain region 23 and comes into contact with the body contact region 24 in the direction from the source region 22 toward the drain region 23, there is no horizontal gap between the body contact region 24 and the ion-doped gate region 25.

The body contact region 24 and the ion-doped gate region 25 may be formed in the semiconductor layer 203 and the gate electrode layer 21, respectively, either in a single ion implantation process, or in separate implantation processes (the body contact region 24 may be formed prior to the formation of the ion-doped gate region 25; or vice versa). In contrast to forming the body contact region 24 and the ion-doped gate region 25 in separate implantation processes, forming them in a single ion implantation process can better make sure that there is no horizontal gap between them and allows direct contact of the body contact region 24 with the gate electrode layer 21. This enables the body contact region 24 to deplete electron holes accumulated in the body, thus mitigating the floating body effect.

The source region 22 and the drain region 23 are of the same conductivity type, while the ion-doped gate region 25 and the body contact region 24 are of the same conductivity type. The body contact region 24 and the source region 22 are of different conductivity types. Therefore, if the source region 22 and the drain region 23 are of the N conductivity type, then the ion-doped gate region 25 and the body contact region 24 are of the P conductivity type. If the source region 22 and the drain region 23 are of the P conductivity type, then the ion-doped gate region 25 and the body contact region 24 are of the N conductivity type. Examples of N-type ions may include phosphorus and arsenic ions, while examples of P-type ions may include boron and gallium ions.

As can be seen from steps S1 to S3 as described above, since at least one end portion of the gate electrode layer 21 laterally spans over the interfaces of the active regions and the trench isolation structures toward the source region 22 and/or the drain region 23, the gate length L3 of this or these end portions is greater than both the gate length L1 of the portion of the gate electrode layer 21 between the end portions and the gate length L1 of the end portions of the rectangular gate electrode layer 11 in the semiconductor device structure shown in FIG. 1, resulting in reduced leakage at the interfaces and improved performance of the semiconductor device.

Additionally, in order to mitigate the floating body effect, the body contact region 24 must be brought into contact with the gate electrode layer 21. In order to ensure contact of the body contact region 24 with the gate electrode layer 21, during design of the affected range of the ion implantation process for forming the body contact region 24, considering the critical dimensions (CD) of the processes for forming the gate electrode layer 21 and the body contact region 24 and possible errors in alignment accuracy of the used photomasks, it is necessary for the affected range to encompass at least part of the gate electrode layer 21. This requires the portion of the gate electrode layer 21 to be brought into contact with the body contact region 24 to have a sufficient gate length. However, an excessive gate length of the gate electrode layer 21 may degrade the performance of the semiconductor device being fabricated. For example, it may lead to problems such as significant parasitic capacitance between the gate electrode layer 21, the gate dielectric layer and the semiconductor layer 203, increased power consumption and a reduced on-current. Through designing the gate electrode layer 21 as consisting of the base gate section 211 and the extended gate section 212, it is only necessary to maintain the desired gate length at the portion of the gate electrode layer 21 brought into contact with the body contact region 24 (i.e., L1, the sum of the gate length of the portion of the base gate section 211 joined to the extended gate section 212 and the gate length of the extended gate section 212) while allowing the portions of the base gate section 211 between the end portions thereof and the extended gate section 212 to have the gate length L2 that is less than the gate length L1. Compared to the designs shown in FIGS. 1 and 2a where the gate length L1 is maintained throughout the portion of the gate electrode layer between the end portions thereof, this design allows the gate electrode layer on the semiconductor layer to have a smaller area, e.g., a minimum allowable area of the base gate section 211 according to certain design rules, with the same channel width of the base gate section 211. Furthermore, as there is no horizontal gap between the body contact region 24 and the ion-doped gate region 25, improved performance of the semiconductor device, reduced parasitic capacitance, lower power consumption and an increased on-current are achievable while taking into account the critical dimensions (CD) of the processes for forming the gate electrode layer 21 and the body contact region 24 and possible errors in alignment accuracy of the used photomasks.

The foregoing description presents merely preferred embodiments of the present disclosure and is not intended to limit the scope of the present disclosure in any sense. It is intended that all changes and modifications made by those of ordinary skill in the art in light of the above teachings fall within the scope of the appended claims.

What is claimed is:

1. A semiconductor device, comprising:
    a semiconductor-on-insulator substrate comprising, stacked from the bottom upward, a lower substrate, a buried insulator layer and a semiconductor layer, wherein active regions surrounded by trench isolation structures are formed in the semiconductor layer;
    a gate electrode layer formed over the semiconductor layer, the gate electrode layer extending from the active regions to the trench isolation structures;
    a source region and a drain region respectively formed in the active regions that are on opposing sides of the gate electrode layer, wherein at least one end portion of the gate electrode layer laterally spans over interfaces of the active regions and the trench isolation structures toward the source region and/or the drain region; and
    a body contact region, which is formed in the source region and brought into contact with the gate electrode layer.

2. The semiconductor device of claim 1, further comprising an ion-doped gate region, which is formed in the gate electrode layer and extends from a side of the gate electrode layer closer to the body contact region toward the drain region, and wherein the body contact region comes into contact with the ion-doped gate region in a direction from the source region toward the drain region.

3. The semiconductor device of claim 2, wherein the gate electrode layer comprises a base gate section and an extended gate section, wherein the source region and the drain region are respectively formed in the active regions that are on opposing sides of the base gate section, wherein at least one end portion of the base gate section laterally spans over interfaces of the active regions and the trench isolation structures toward the source region and/or the drain region, and wherein the extended gate section extends at least from the base gate section toward the source region.

4. The semiconductor device of claim 3, wherein the extended gate section extending at least from the base gate section toward the source region includes:
    extension of the extended gate section from the base gate section toward the source region; or extension of the extended gate section from the base gate section toward both the source region and the drain region.

5. The semiconductor device of claim 4, wherein in the case of the extended gate section extending from the base gate section toward the source region, the ion-doped gate region is entirely located in the extended gate section, or further extends from the extended gate section into the base gate section.

6. The semiconductor device of claim 4, wherein in the case of the extended gate section extending from the base gate section toward both the source region and the drain region, the ion-doped gate region is entirely located in a portion of the extended gate section located closer to the source region, or further extends from the extended gate section into the base gate section, or even into a portion of the extended gate section located closer to the drain region.

7. The semiconductor device of claim 2, wherein the source region and the drain region are of a same conductivity type, wherein the body contact region and the ion-doped gate region are of a same conductivity type, and wherein the body contact region and the source region are of different conductivity types.

8. The semiconductor device of claim 1, wherein a gate dielectric layer is present between the gate electrode layer and the semiconductor layer.

9. A semiconductor device, comprising:
    a semiconductor-on-insulator substrate comprising, stacked from the bottom upward, a lower substrate, a buried insulator layer and a semiconductor layer, wherein active regions surrounded by trench isolation structures are formed in the semiconductor layer;
    a gate electrode layer formed over the semiconductor layer, the gate electrode layer extending from the active regions to the trench isolation structures, wherein the gate electrode layer comprises a base gate section and an extended gate section;
    a source region and a drain region respectively formed in the active regions that are on opposing sides of the base gate section, wherein at least one end portion of the gate electrode layer laterally spans over interfaces of the active regions and the trench isolation structures toward the source region and/or the drain region; and
    a body contact region straddling over the extended gate section and remote from the base gate section,
    wherein the body contact region is formed in the source region and brought into contact with the gate electrode layer.

10. The semiconductor device of claim 9, wherein the extended gate section extends from the base gate section toward the source region.

11. The semiconductor device of claim 9, further comprising an ion-doped gate region, which is entirely located in the extended gate section, and wherein the body contact region comes into contact with the ion-doped gate region.

12. The semiconductor device of claim 9, wherein the body contact region straddles over an end of the extended gate section.

13. A method of fabricating a semiconductor device, the method comprising:
    providing a semiconductor-on-insulator substrate comprising, stacked from the bottom upward, a lower substrate, a buried insulator layer and a semiconductor layer, wherein active regions surrounded by trench isolation structures are formed in the semiconductor layer;
    forming a gate electrode layer over the semiconductor layer, the gate electrode layer extending from the active regions to the trench isolation structures;
    forming a source region and a drain region in the active regions that are on opposing sides of the gate electrode layer, wherein at least one end portion of the gate electrode layer laterally spans over interfaces of the active regions and the trench isolation structures toward the source region and/or the drain region; and
    forming a body contact region in the source region, wherein the body contact region is in contact with the gate electrode layer.

14. The method of claim 13, further comprising forming an ion-doped gate region in the gate electrode layer, the ion-doped gate region extending from a side of the gate electrode layer closer to the body contact region toward the drain region, the body contact region coming into contact with the ion-doped gate region in a direction from the source region toward the drain region.

15. The method of claim 14, wherein the gate electrode layer comprises a base gate section and an extended gate section, wherein the source region and the drain region are respectively formed in the active regions that are on opposing sides of the base gate section, wherein at least one end portion of the base gate section laterally spans over interfaces of the active regions and the trench isolation structures toward the source region and/or the drain region, and wherein the extended gate section extends at least from the base gate section toward the source region.

16. The method of claim 15, wherein the extended gate section extending at least from the base gate section toward the source region includes: extension of the extended gate section from the base gate section toward the source region; or extension of the extended gate section from the base gate section toward both the source region and the drain region.

17. The method of claim 16, wherein in the case of the extended gate section extending from the base gate section toward the source region, the ion-doped gate region is entirely located in the extended gate section, or further extends from the extended gate section into the base gate section.

18. The method of claim 16, wherein in the case of the extended gate section extending from the base gate section toward both the source region and the drain region, the ion-doped gate region is entirely located in a portion of the extended gate section located closer to the source region, or further extends from the extended gate section into the base gate section, or even into a portion of the extended gate section located closer to the drain region.

* * * * *